(12) United States Patent
Hung et al.

(10) Patent No.: US 11,961,779 B2
(45) Date of Patent: Apr. 16, 2024

(54) 3DIC PACKAGING WITH HOT SPOT THERMAL MANAGEMENT FEATURES

(71) Applicant: Taiwan Semiconductor Manufacturing Co., Ltd., Hsinchu (TW)

(72) Inventors: Wensen Hung, Zhubei (TW); Szu-Po Huang, Taichung (TW); Hsiang-Fan Lee, Hsinchu (TW); Kim Hong Chen, Fremont, CA (US); Chi-Hsi Wu, Hsinchu (TW); Shin-Puu Jeng, Hsinchu (TW)

(73) Assignee: Taiwan Semiconductor Manufacturing Company, Ltd. (TSMC)., Hsin-Chu (TW)

( * ) Notice: Subject to any disclaimer, the term of this patent is extended or adjusted under 35 U.S.C. 154(b) by 315 days.

(21) Appl. No.: 17/331,945

(22) Filed: May 27, 2021

(65) Prior Publication Data
US 2021/0287956 A1 Sep. 16, 2021

Related U.S. Application Data

(63) Continuation of application No. 16/587,463, filed on Sep. 30, 2019, now Pat. No. 11,037,852, which is a
(Continued)

(51) Int. Cl.
*H01L 23/36* (2006.01)
*H01L 23/00* (2006.01)
(Continued)

(52) U.S. Cl.
CPC .............. *H01L 23/36* (2013.01); *H01L 23/04* (2013.01); *H01L 23/10* (2013.01); *H01L 23/3675* (2013.01); *H01L 23/3677* (2013.01); *H01L 23/42* (2013.01); *H01L 23/49822* (2013.01); *H01L 23/49827* (2013.01); *H01L 25/0652* (2013.01); *H01L 25/0657* (2013.01); *H01L 23/49816* (2013.01); *H01L 24/13* (2013.01); *H01L 24/16* (2013.01); *H01L 24/32* (2013.01); *H01L 24/73* (2013.01); *H01L 24/83* (2013.01);
(Continued)

(58) Field of Classification Search
CPC . H10B 80/00; H01L 25/0652; H01L 25/0657; H01L 23/36; H01L 23/04; H01L 23/10; H01L 23/42; H01L 23/3675; H01L 23/3677; H01L 23/49822; H01L 23/49827
USPC ........................................................ 257/690
See application file for complete search history.

(56) References Cited

U.S. PATENT DOCUMENTS 7,415,762 B2 8/2008 Fukase et al.
7,415,792 B1 8/2008 Fukase et al.
(Continued)

FOREIGN PATENT DOCUMENTS

CN 1716587 A 1/2006
JP 201182293 A 4/2011

*Primary Examiner* — Jasmine J Clark
(74) *Attorney, Agent, or Firm* — Slater Matsil, LLP

(57) ABSTRACT

A package includes a substrate having a conductive layer, and the conductive layer comprises an exposed portion. A die stack is disposed over the substrate and electrically connected to the conductive layer. A high thermal conductivity material is disposed over the substrate and contacting the exposed portion of the conductive layer. The package further includes a contour ring over and contacting the high thermal conductivity material.

20 Claims, 18 Drawing Sheets

Related U.S. Application Data continuation of application No. 16/206,903, filed on Nov. 30, 2018, now Pat. No. 10,461,009, which is a continuation of application No. 15/676,963, filed on Aug. 14, 2017, now Pat. No. 10,157,813, which is a continuation of application No. 14/096,952, filed on Dec. 4, 2013, now Pat. No. 9,735,082.

(51) Int. Cl.
| | | |
|---|---|---|
| *H01L 23/04* | (2006.01) | |
| *H01L 23/10* | (2006.01) | |
| *H01L 23/367* | (2006.01) | |
| *H01L 23/42* | (2006.01) | |
| *H01L 23/498* | (2006.01) | |
| *H01L 25/065* | (2023.01) | |
| *H01L 25/18* | (2023.01) | |

(52) U.S. Cl.
CPC ............ *H01L 24/92* (2013.01); *H01L 25/18* (2013.01); *H01L 2224/13025* (2013.01); *H01L 2224/131* (2013.01); *H01L 2224/16145* (2013.01); *H01L 2224/16227* (2013.01); *H01L 2224/29011* (2013.01); *H01L 2224/291* (2013.01); *H01L 2224/2919* (2013.01); *H01L 2224/29294* (2013.01); *H01L 2224/29339* (2013.01); *H01L 2224/32225* (2013.01); *H01L 2224/32245* (2013.01); *H01L 2224/33181* (2013.01); *H01L 2224/33519* (2013.01); *H01L 2224/73204* (2013.01); *H01L 2224/73253* (2013.01); *H01L 2224/81815* (2013.01); *H01L 2224/83191* (2013.01); *H01L 2224/92125* (2013.01); *H01L 2224/92225* (2013.01); *H01L 2225/06513* (2013.01); *H01L 2225/06517* (2013.01); *H01L 2225/06541* (2013.01); *H01L 2225/06568* (2013.01); *H01L 2225/06589* (2013.01); *H01L 2924/1431* (2013.01); *H01L 2924/1432* (2013.01); *H01L 2924/1434* (2013.01); *H01L 2924/1436* (2013.01); *H01L 2924/15311* (2013.01); *H01L 2924/16153* (2013.01); *H01L 2924/16251* (2013.01); *H01L 2924/1679* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | |
|---|---|---|
| 8,310,045 B2 | 11/2012 | Son |
| 8,379,400 B2 | 2/2013 | Sunohara |
| 8,921,993 B2 | 12/2014 | Choi et al. |
| 9,013,031 B2 | 4/2015 | Im et al. |
| 9,070,677 B2 | 6/2015 | Park |
| 9,735,082 B2 * | 8/2017 | Hung .................... H01L 23/36 |
| 9,935,090 B2 | 4/2018 | Yu et al. |
| 10,056,267 B2 | 8/2018 | Cheng et al. |
| 10,461,009 B2 | 10/2019 | Hung et al. |
| 2005/0133916 A1 | 6/2005 | Karnezos |
| 2007/0152312 A1 | 7/2007 | Tang et al. |
| 2009/0072382 A1 | 3/2009 | Guzek |
| 2011/0080713 A1 | 4/2011 | Sunohara |
| 2013/0043581 A1 | 2/2013 | Negoro |
| 2013/0119528 A1 | 5/2013 | Groothuis |
| 2013/0277821 A1 | 10/2013 | Lundberg |
| 2014/0084444 A1 | 3/2014 | Lin |
| 2014/0264821 A1 | 9/2014 | Tang et al. |
| 2015/0001708 A1 | 1/2015 | Lin |
| 2015/0035134 A1 | 2/2015 | Vadhavkar et al. |
| 2015/0035135 A1 | 2/2015 | Hung |
| 2016/0013115 A1 | 1/2016 | Vadhavkar et al. |
| 2016/0133602 A1 | 5/2016 | Chen et al. |
| 2016/0141260 A1 | 5/2016 | Chang et al. |
| 2017/0162542 A1 | 6/2017 | Chen et al. |
| 2017/0170155 A1 | 6/2017 | Yu et al. |
| 2017/0229439 A1 | 8/2017 | Vadhavkar et al. |

* cited by examiner

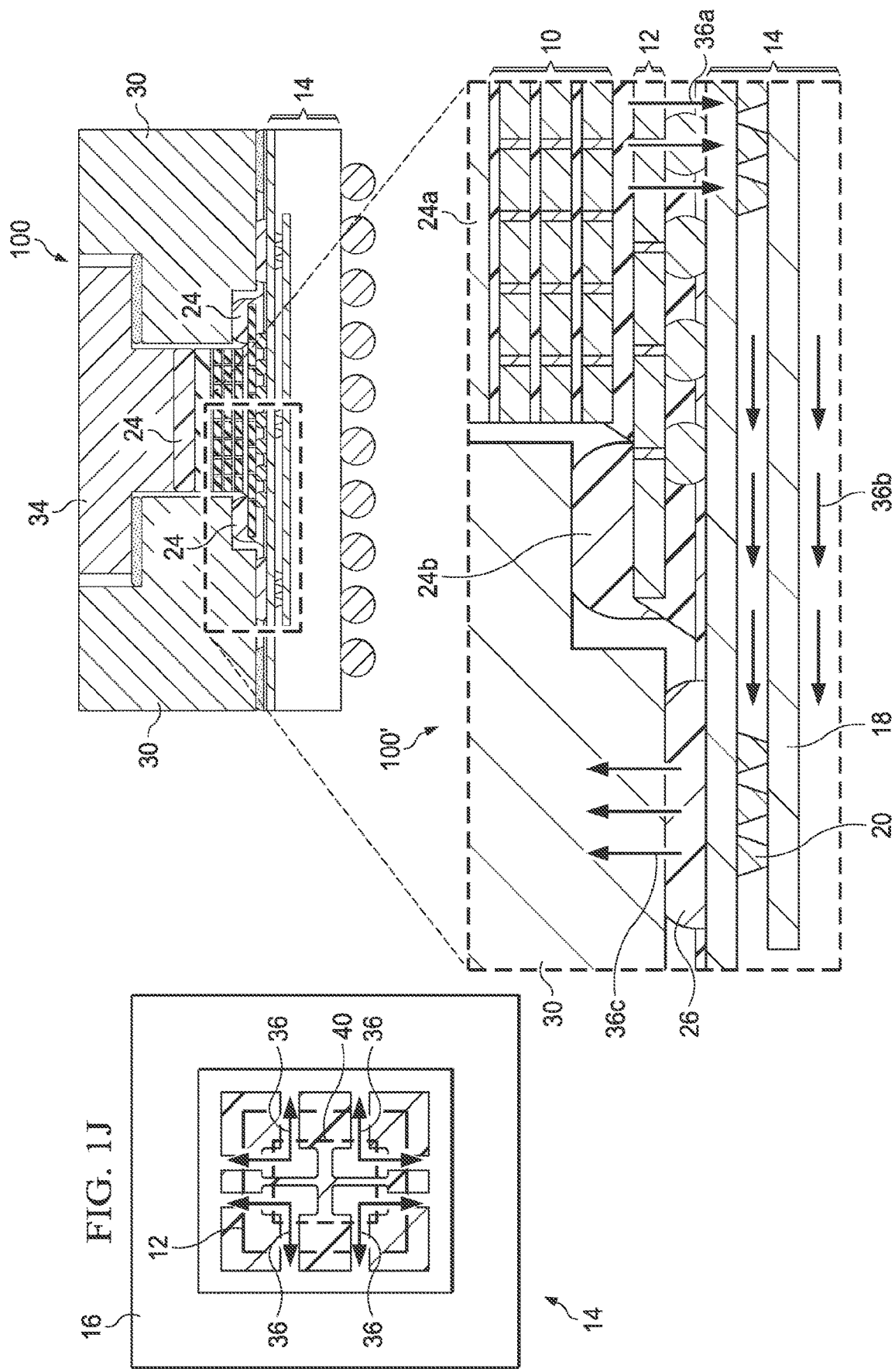

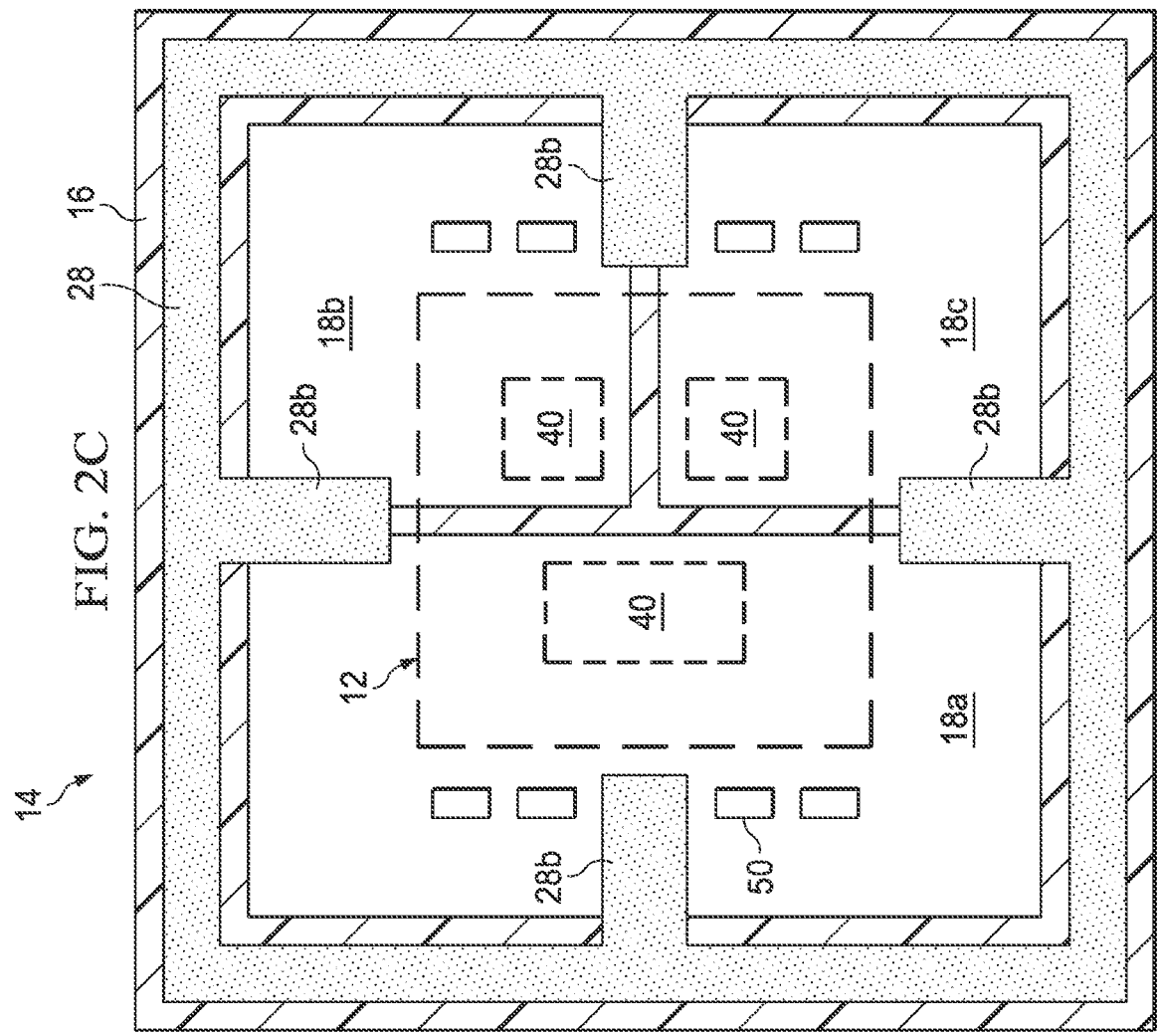

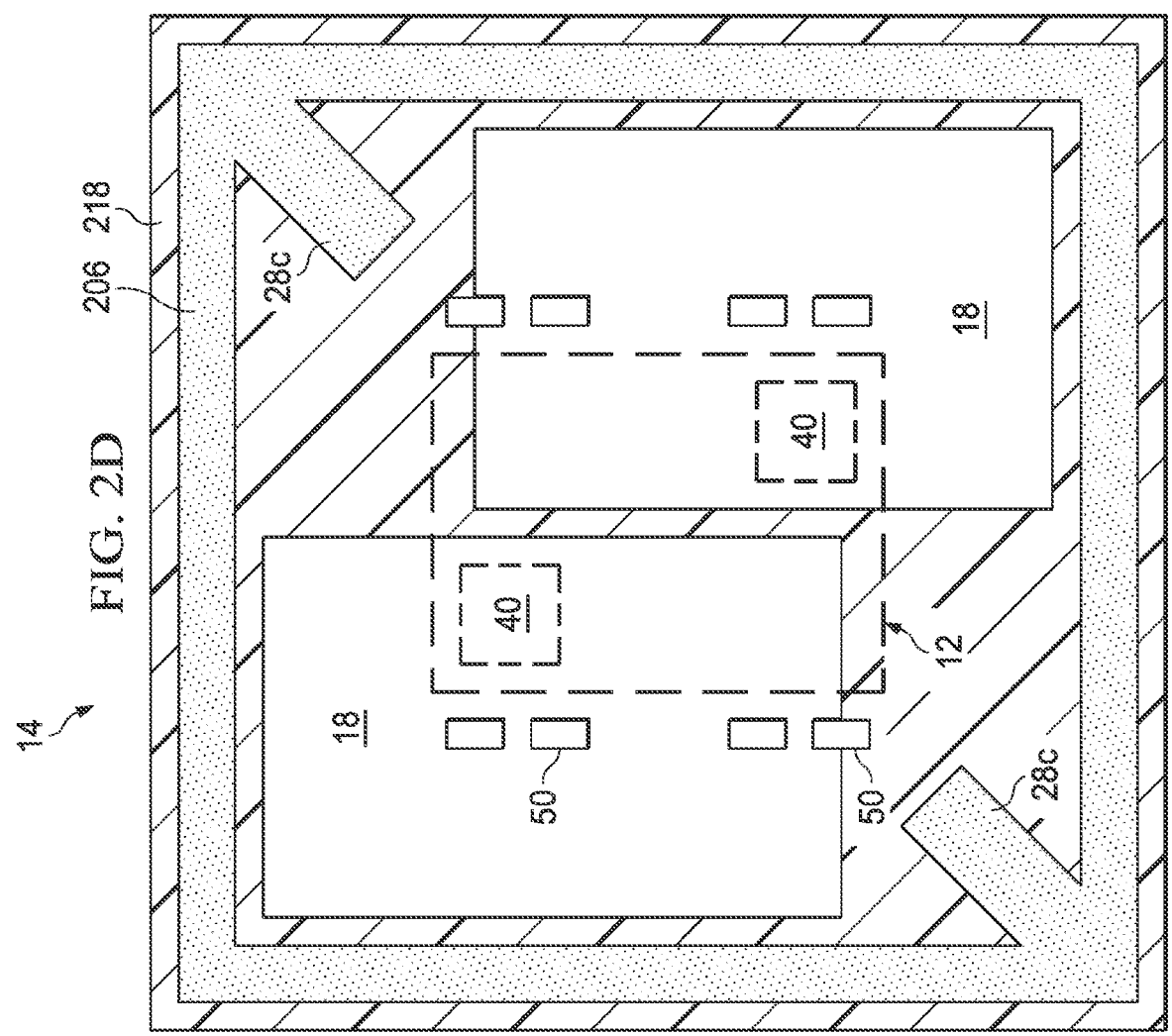

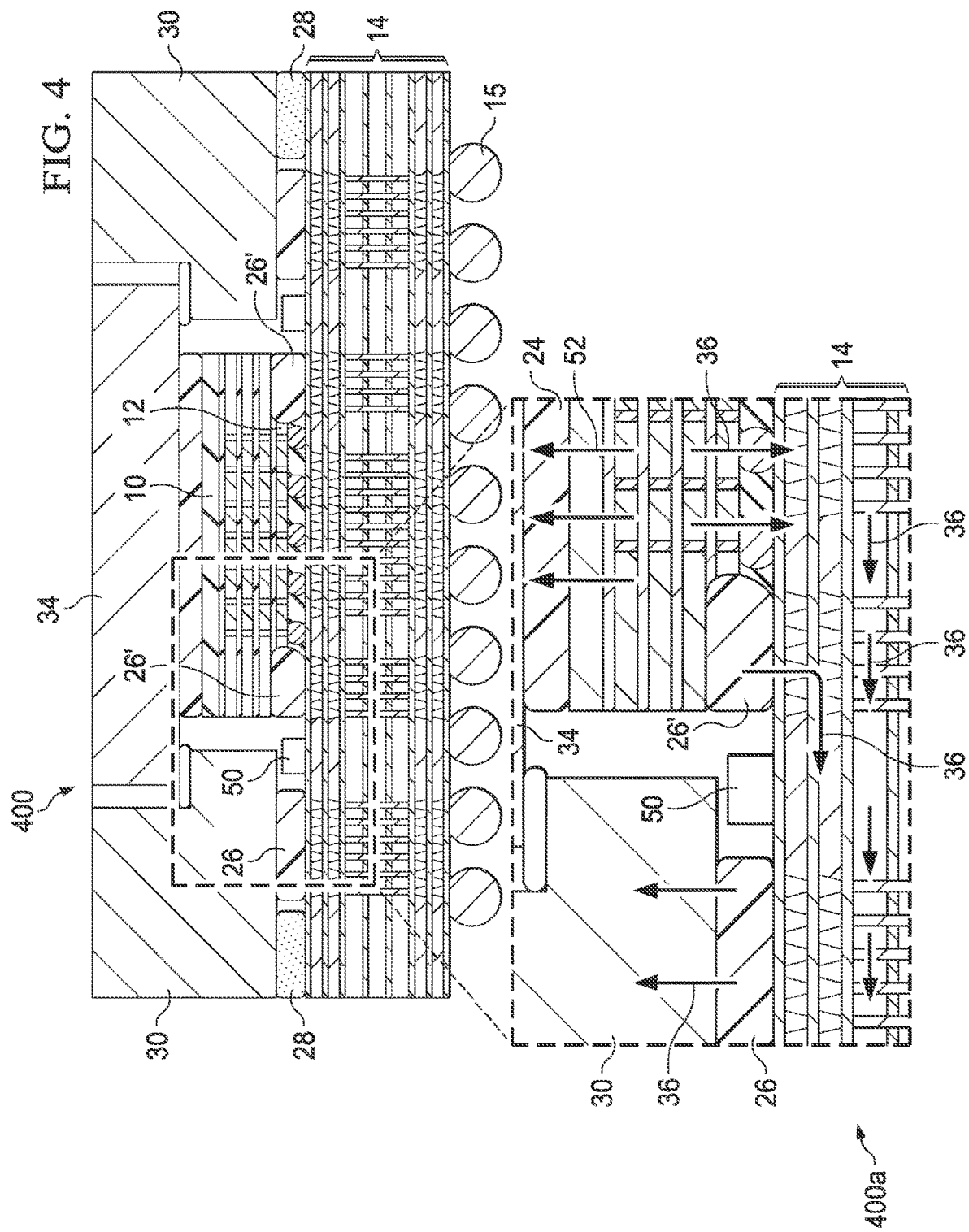

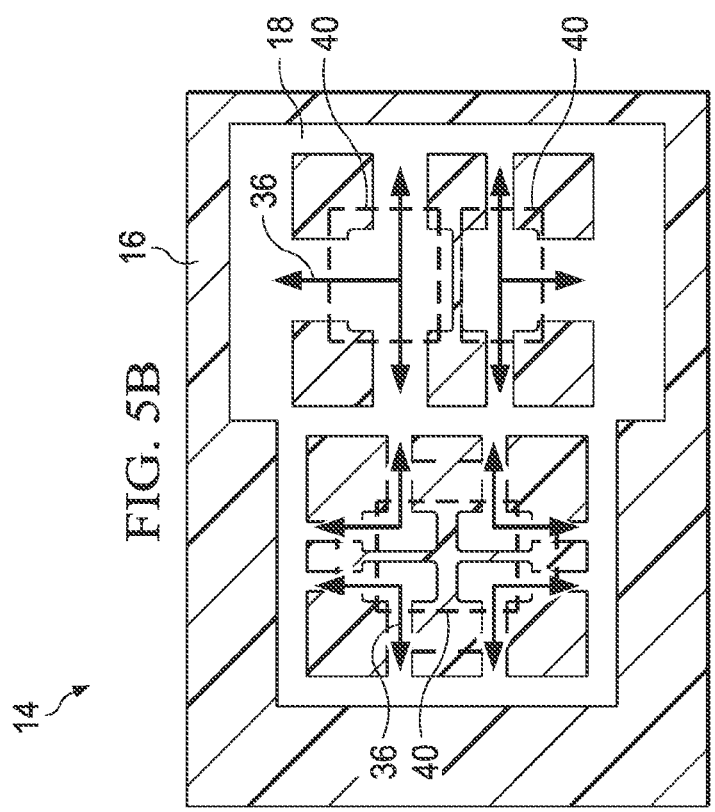

3DIC PACKAGING WITH HOT SPOT THERMAL MANAGEMENT FEATURES

PRIORITY CLAIM AND CROSS-REFERENCE

This patent application is a continuation of U.S. application Ser. No. 16/587,463, filed on Sep. 30, 2019, now U.S. Pat. No. 11,037,852, issued on Jun. 15, 2021, which is a continuation of U.S. application Ser. No. 16/206,903, filed on Nov. 30, 2018, now U.S. Pat. No. 10,461,009, issued on Oct. 29, 2019, which is a continuation of U.S. Application No. 15/676,963, filed on Aug. 14, 2017, now U.S. Pat. No. 10,157,813, issued Dec. 18, 2018, which is a continuation of U.S. application Ser. No. 14/096,952, filed on Dec. 4, 2013, now U.S. Pat. No. 9,735,082, issued Aug. 15, 2017 which applications are hereby incorporated by reference herein as if reproduced in their entireties.

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). Heat dissipation is a challenge in the 3DICs. There exists a bottleneck in efficiently dissipating the heat generated in the inner dies of the 3DICs. The heat generated in the inner dies has to be dissipated to outer components such as outer dies before the heat can be conducted to any heat spreader. Between the stacked dies, however, there exist other materials such as underfill, molding compound, etc, which are not effective in conducting heat. As a result, the heat may be trapped in an inner region of a bottom stacked die and cause a sharp local temperature peak (sometimes referred to as a hot spot). Furthermore, hot spots due to heat generated by devices at the bottom of the stacked dies may also negatively affect the electrical performance of other overlaying devices in the stacked dies as well as the reliability of the whole 3DIC package.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A-1J are cross-sectional and top down views of intermediate stages in the formation of a package in accordance with various embodiments;

FIGS. 2A-2D illustrate cross sectional and top down views of the package in accordance with various alternative embodiments having alternative substrate configurations;

FIG. 4 illustrates cross sectional view of the package in accordance with alternative embodiments having an alternative die stack configuration; and FIGS. 5A and 5B illustrate cross sectional and top down views of the package in accordance with alternative embodiments having multiple die stacks.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package with efficient hot spot thermal management features and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1A:
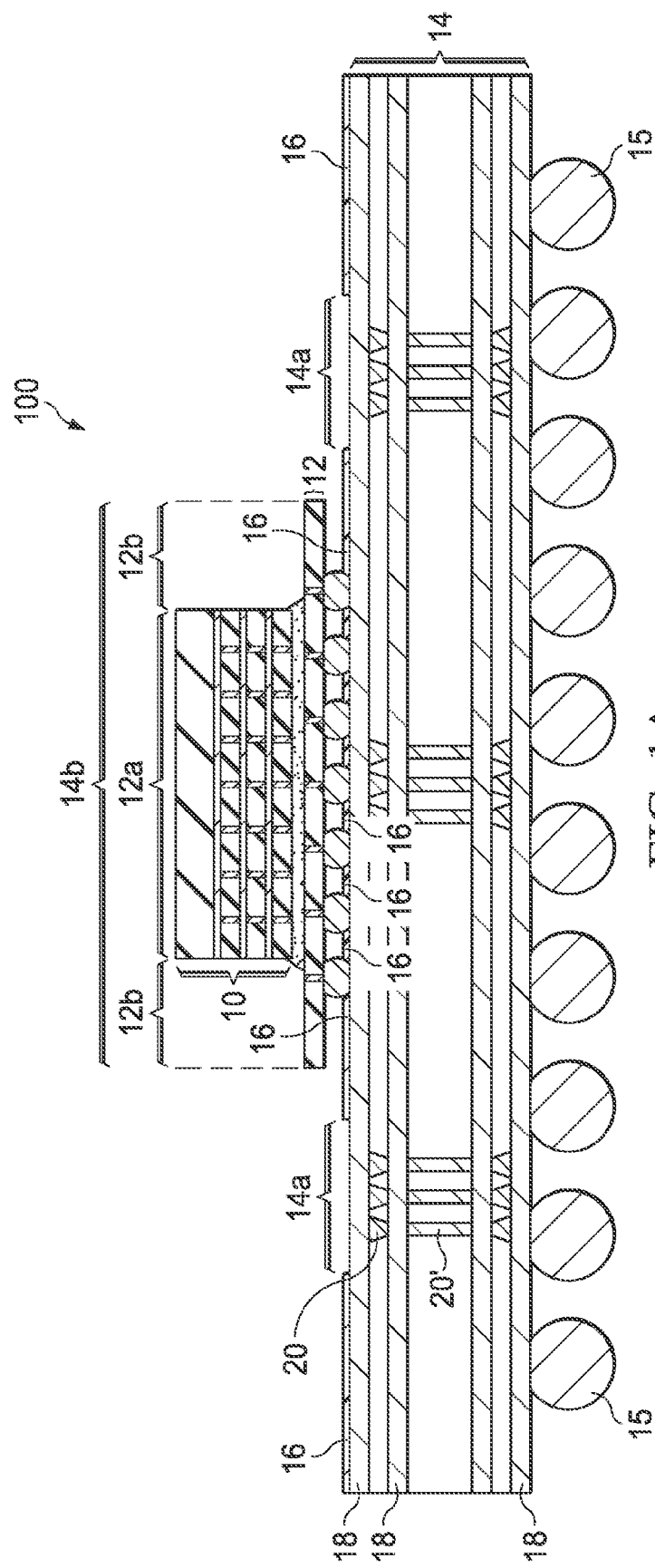

FIG. 1A illustrates the cross-sectional view of an initial stage in the formation of Three-Dimensional Integrated Circuit (3DIC) package 100, which includes dies 10 stacked on die 12 forming a die stack 10/12. In some embodiments, dies 10 are memory dies that form a memory stack. In alternative embodiments, dies 10 are logic dies. In other alternative embodiments, dies 10 include both logic dies and memory dies. Die 12 may be a logic die, which may further be a Central Processing Unit (CPU), a Graphics Processing Unit (GPU), or the like. Dies 10 and 12 may be bonded through flip chip bonding, wherein metal bumps, solder balls, or the like are used to bond dies 10 and 12.

Die 12 has a top view size greater than the top view size of dies 10. As shown in FIG. 1A, die 12 may extend laterally beyond dies 10, and may include portion 12a that is overlapped by dies 10, and portions 12b that are not overlapped by dies 10. The die stack including dies 10 and 12 are further bonded to substrate 14. Substrate 14 may be a package substrate, an interposer, a Printed Circuit Board (PCB), or the like. Discrete passive devices (not shown) such as resistors, capacitors, transformers, and the like, may also be bonded to substrate 14. Solder balls 15 are attached to substrate 14, wherein die stack 10/12 and solder balls 15 are on opposite sides of substrate 14.

Figure 1B:
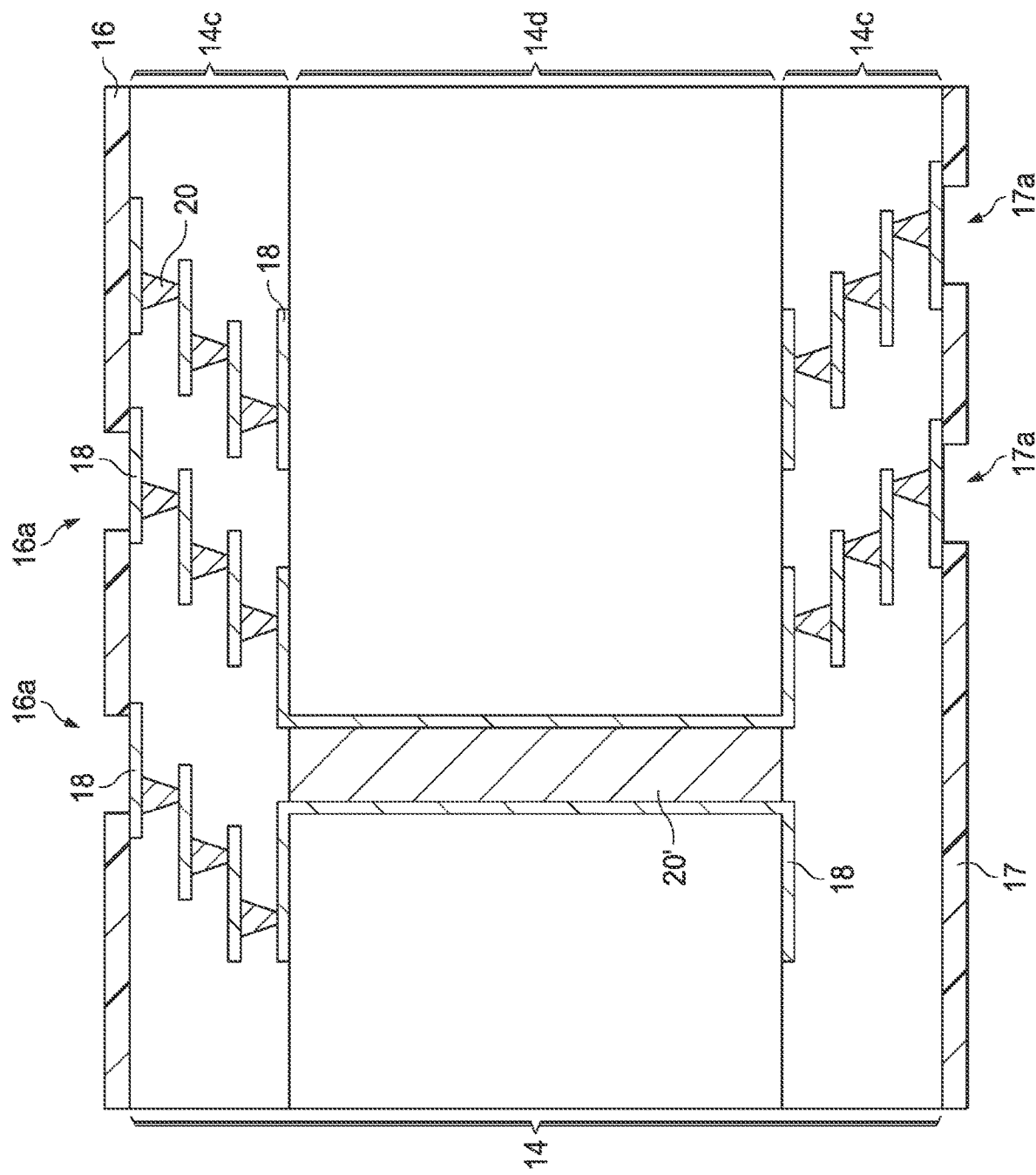
Figure 1C:
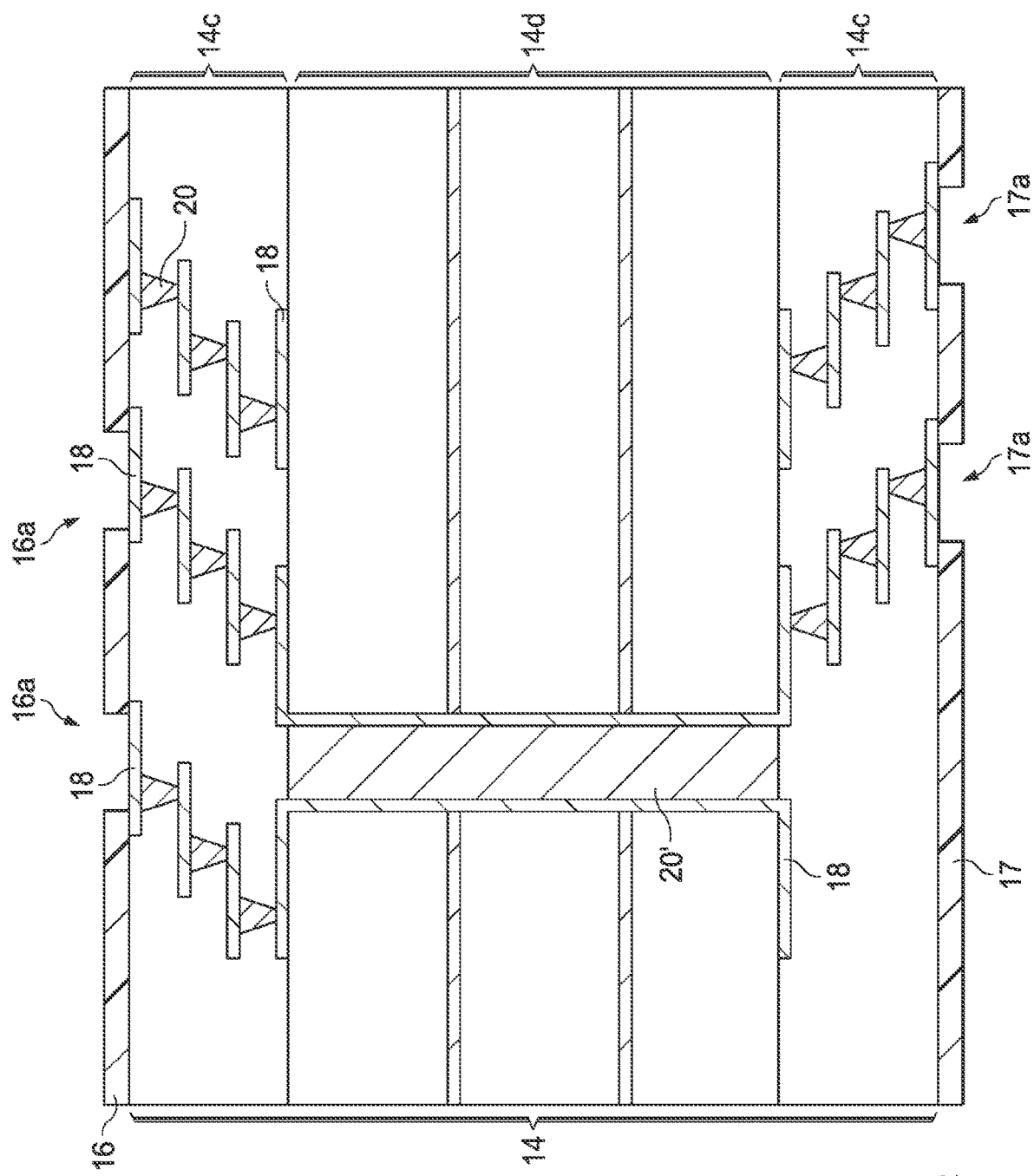

Substrate 14 includes conductive features such as conductive layers 18 and conductive vias 20 (including through-vias 20', please refer to FIG. 1C). Conductive layers 18 and conductive vias 20 may be formed of any suitable material such as copper foil (e.g., 0.5 oz to 2 oz thick copper foil) and copper/copper alloy, respectively. Other conductive materials may also be used. Conductive features 18/20 may be used in package 100 for thermal conductive purposes to dissipate heat away from the center of die stack 10/12. In some embodiments, conductive features 18/20 may also be used for electrical connections, for example, as ground, power, and/or signal input and output (TO) layers in substrate 14. In other embodiments, some or all conductive features 18/20 may not serve electrical functions and may be referred to as dummy features.

A patterned solder resist 16 is disposed over substrate 14. Solder resist 16 may be a protective layer that covers portions of substrate 14 to protect it from damage. Solder resist 16 may be formed of a polymer, which may also be a photoresist. The patterning of solder resist 16 may be performed, for example, using photolithography techniques. Solder resist 16 is patterned to expose portions (e.g., portions 14a and 14b) of a top conductive layer 18 in substrate 14. Portions 14b of the substrate may be exposed to allow electrical connections to conductive features 18/20. For example, in FIG. 1A, portion 14b corresponds to the portion of substrate 14 underlying die stack 10/12 between the connectors (e.g., solder balls) of die stack 10/12. In other embodiments, portion 14b may also correspond to portions of substrate 14 having electrical connections to discrete passive devices (not shown). Portions 14a of the substrate are also exposed. Portions 14a may be exposed for thermal dissipation purposes rather than electrical connection purposes. Exposed portions 14a may be electrically connected to die stack 10/12 through exposed portion 14b and conductive features 18/20. However, there may be no electrical devices (e.g., die stacks or passive components) in package 100 directly disposed over exposed portions 14a.

FIG. 1B illustrates a detailed cross-sectional view of substrate 14 in accordance with various embodiments. FIG. 1C illustrates alternative embodiments of substrate 14. As illustrated by FIGS. 1B and 1C, substrate 14 may include a core 14d and build-up layers 14c disposed on a front side and backside of core 14d. A through-via 20' may extend from the front side of core 14d and electrically connect to the backside of core 14d. Core 14d may include conductive layers 18 (e.g., copper foil). Core 14d may include two (as illustrated in FIG. 1B), four (as illustrated in FIG. 1C), six, eight, or more conductive layers 18. The number of conductive layers 18 may depend on layout design (e.g., electrical circuit design) of package 100 although additional conductive layers may increase the overall thermal conductivity of substrate 14.

Build-up layers 14c include an interconnect structure having patterned conductive layers 18 electrically connected by conductive vias 20. In various embodiments conductive features 18/20 may serve functional electrical purposes such as power, ground, and/or signal 10 layers. In various other embodiments, conductive features 18/20 may include dummy features for increased thermal conductivity. Although three build-up layers 14c are illustrated on either side of core 14d in both FIGS. 1B and 1C, alternative embodiments may include a different number of build-up layers 14c depending on layout design.

Solder resist 16 is disposed over a front side of substrate 14. Solder resist 16 may be patterned to include openings 16a to expose portions of conductive layer 18 in substrate 14. Certain openings 16a allow for electrical connection to devices (e.g., die stack 10/12 or passive devices) to substrate 14. In various embodiments, at least some openings 16a may be used for heat dissipation as will be explained in greater detail in subsequent paragraphs. A solder resist 17 may also be disposed over a backside of substrate 14. Solder resist 17 may also be patterned to include openings 17a exposing certain conductive layers 18. Solder balls (e.g., solder balls 15 of FIG. 1A) may be attached to substrate 14 through these openings 17a.

Figure 1D:
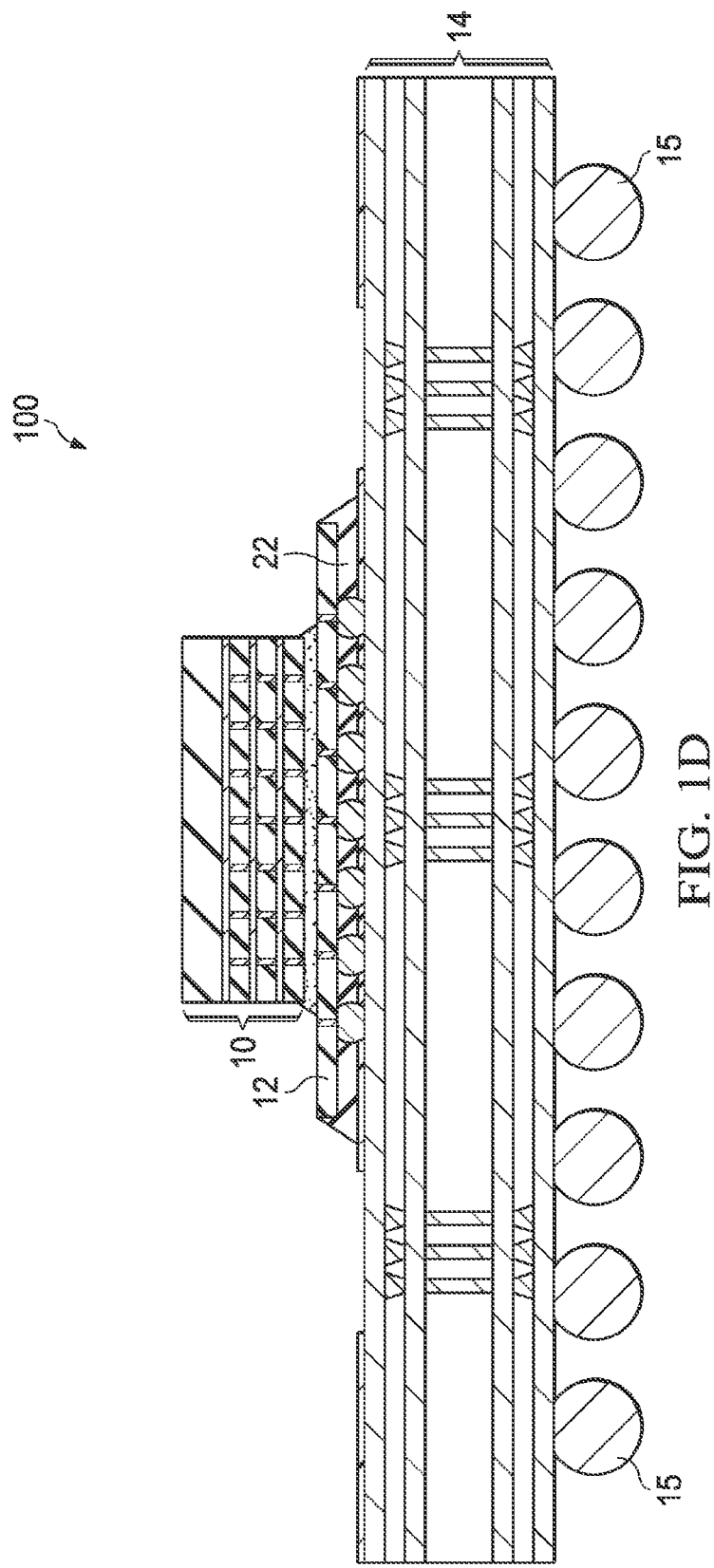

In FIG. 1D, A reflow is performed to reflow the solder balls in die stack 10/12 to substrate 14. An underfill 22 may then be dispensed between die 12 and substrate 14.

Figure 1E:
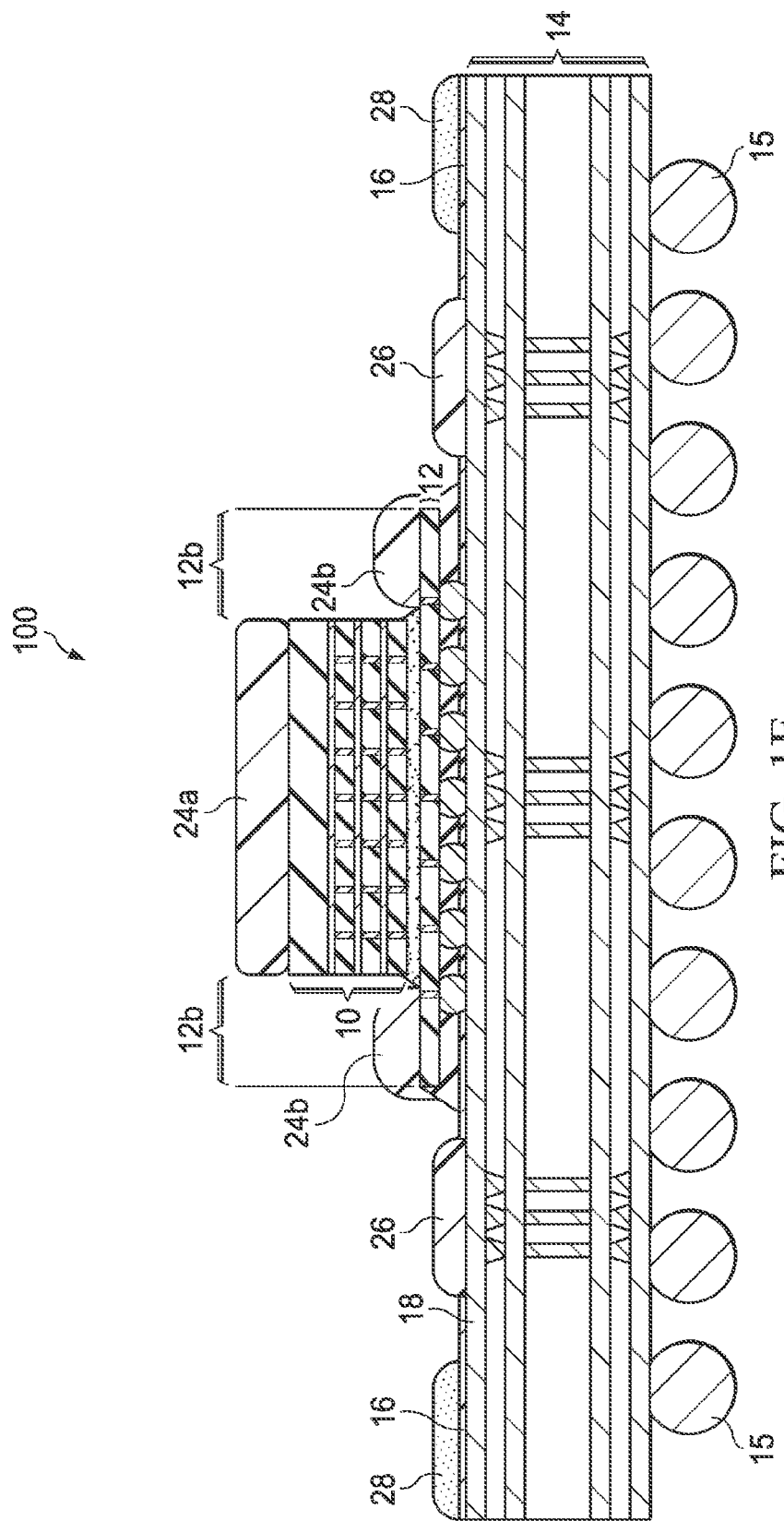

Next, referring to FIG. 1E, a thermal interface material (TIM) 24 is dispensed on dies 10 and 12. TIM 24 includes portion 24a, which is dispensed on the top of dies 10. Furthermore, TIM 24 includes portions 24b, which are also dispensed on, and may be in physical contact with, the top surfaces of portions 12B of die 12. TIM 24 may be a polymer having a good thermal conductivity, which may be between about 3 watts per meter kelvin (W/m·K) to about 5 W/m·K or more. TIM portions 24b may, or may not, form a ring. In accordance with some embodiments, when forming the ring, TIM portions 24b encircle dies 10. In which embodiments, portions 12B of die 12 also form a ring encircling dies 10.

Furthermore, a high thermal conductivity (Tk) material 26 is dispensed over exposed portions (i.e., portions 14a in FIG. 1A) of substrate 14. High Tk material 26 may be in physical contact with conductive layers 18 allowing heat to be thermally conducted from conductive layers 18 to high Tk material 26. High Tk material 26 may be any material having high thermal conductivity, which may be between about 3 W/m·K and 50 W/m·K or more. For example, high Tk material 26 may be a TIM (e.g., formed of a same material as TIM 24), solder, silver paste, or the like. In various embodiments, high Tk material 26 may have a thickness of about 5 μm to about 100 μm.

An adhesive 28 (e.g., an epoxy, silicon resin, or the like) is dispensed over an otherwise unoccupied portion of substrate 14. Adhesive 28 may have a better adhering ability and a lower thermal conductivity than TIM 24 and high Tk material 26. For example, adhesive 28 may have a thermal conductivity lower than about 0.5 W/m·K. Adhesive 28 may be positioned so as to not interfere with the placement of other features (e.g., device stack 10/12, passive devices (not shown), and high Tk material 26) over substrate 14. In various embodiments, adhesive 28 may have a thickness of about 100 μm.

Figure 1G:
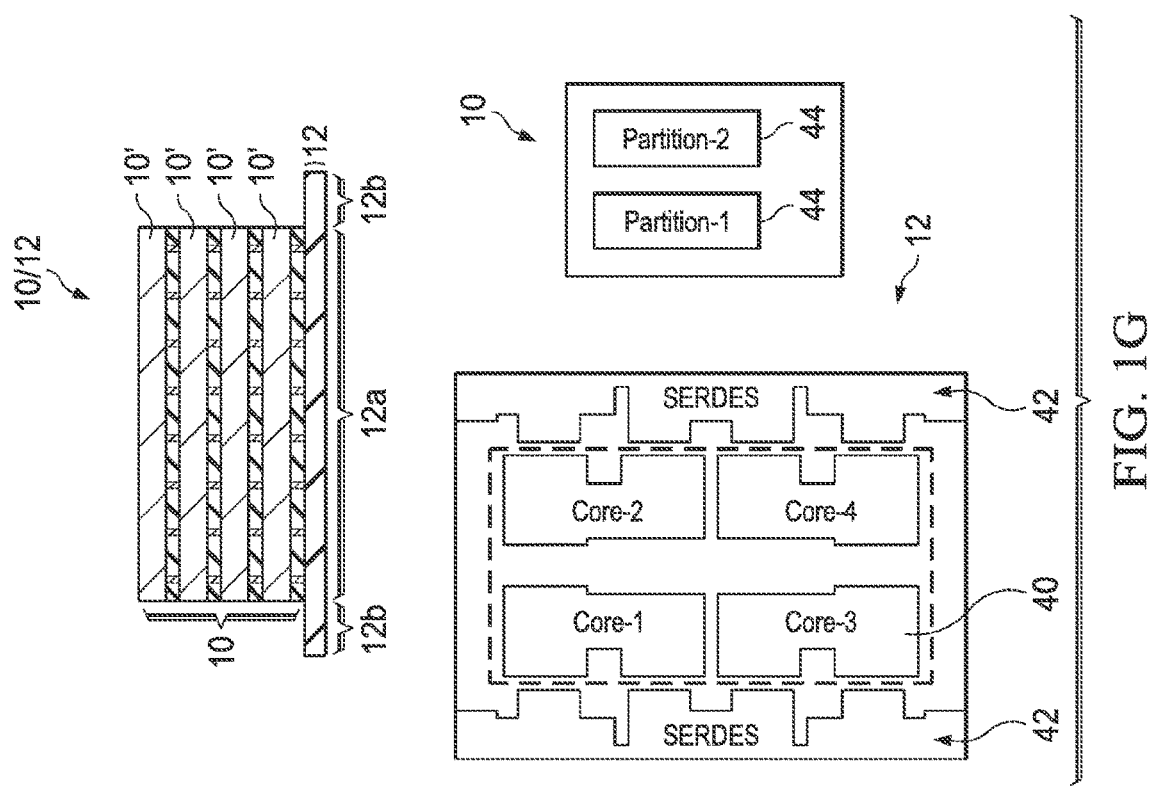
Figure 1F:
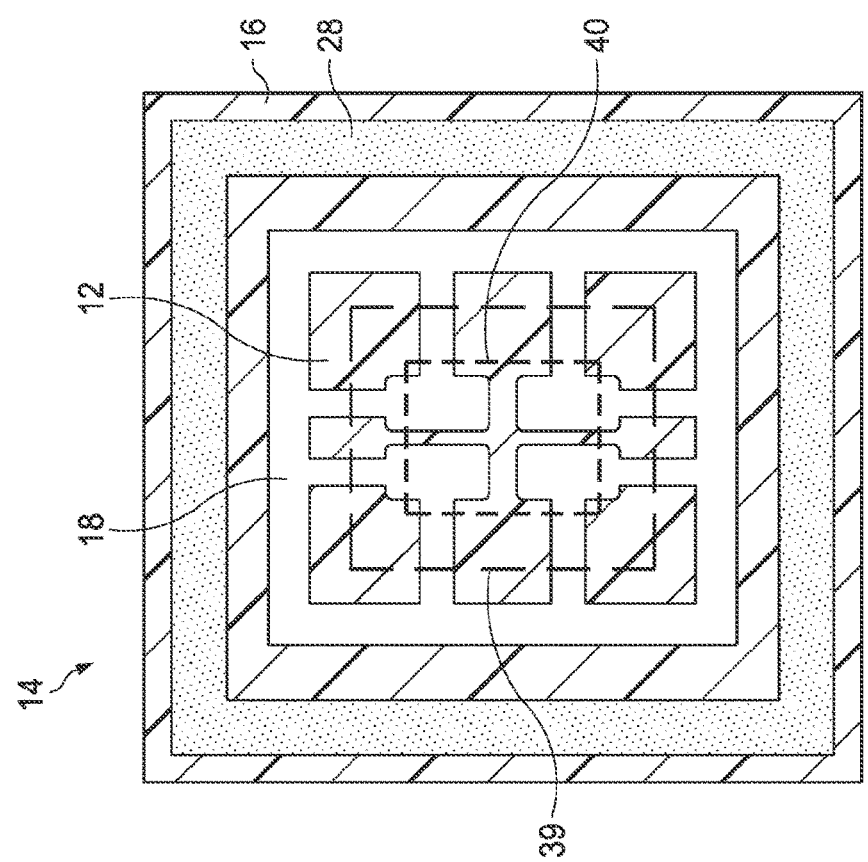

FIG. 1F illustrates a top down view of substrate 14, solder resist 16, and adhesive 28. For ease of illustration, high Tk material 26 is omitted from FIG. 1F. The location of die 12 is indicated by a dashed line 39, while a logic core region of die 12 is indicated by dashed line 40. As illustrated in FIG. 1F, portions of conductive layer 18 in substrate 14 are exposed around and surrounding die 12 and logic core 40. As will be explained in greater detail in subsequent paragraphs, the exposed conductive layer 18 may function as a heat dissipation feature to conduct heat away from logic core 40. At least a portion of exposed conductive layer 18 may also allow electrical connections between substrate 14 and die stack 10/12.

FIG. 1G illustrates a cross-sectional view of die stack 10/12 and logic floor plans for dies 10 and 12. Dies 10 and 12 may be laid out to minimize thermal crosstalk between devices in dies 10 and 12 and improve heat dissipation. For example, die 12 may include a logic core 40 and other logic circuits 42. The other logic circuits 42 may include one or more Serializers/Deserializers (Serdes). Serdes 42 are logic control circuits that may consume a relatively high amount of power, and hence generate a relatively high amount of heat. In accordance with some embodiments, Serdes 42 (or other high-power circuits) are at least partially, and possibly entirely, allocated in portions 12b of die 12, which portions 12b are not overlapped by dies 10, as shown in FIG. 1G. Thus, the effect of heat generated by Serdes 42 may not directly affect the functionality of devices in dies 10.

A logic core 40 may be located at least partially, and possibly entirely, in portion 12a of die 12, which portion 12a is overlapped by dies 10, as shown in FIG. 1G. An exemplary floor plan of die 10 (e.g., a memory die) is also illustrated. Memory die 10 may include a plurality of dynamic random access memory (DRAM) partitions 44. Without thermal management features, heat from logic core 40 may negatively affect the performance of overlaying devices (e.g., DRAM partitions 44) in dies 10. Thus, various embodiments may include various hot spot thermal management features (e.g., comprising exposed conductive layers 18) to conduct heat away from logic core 40 so as to not negatively impact the performance of dies 10.

Figure 1H:
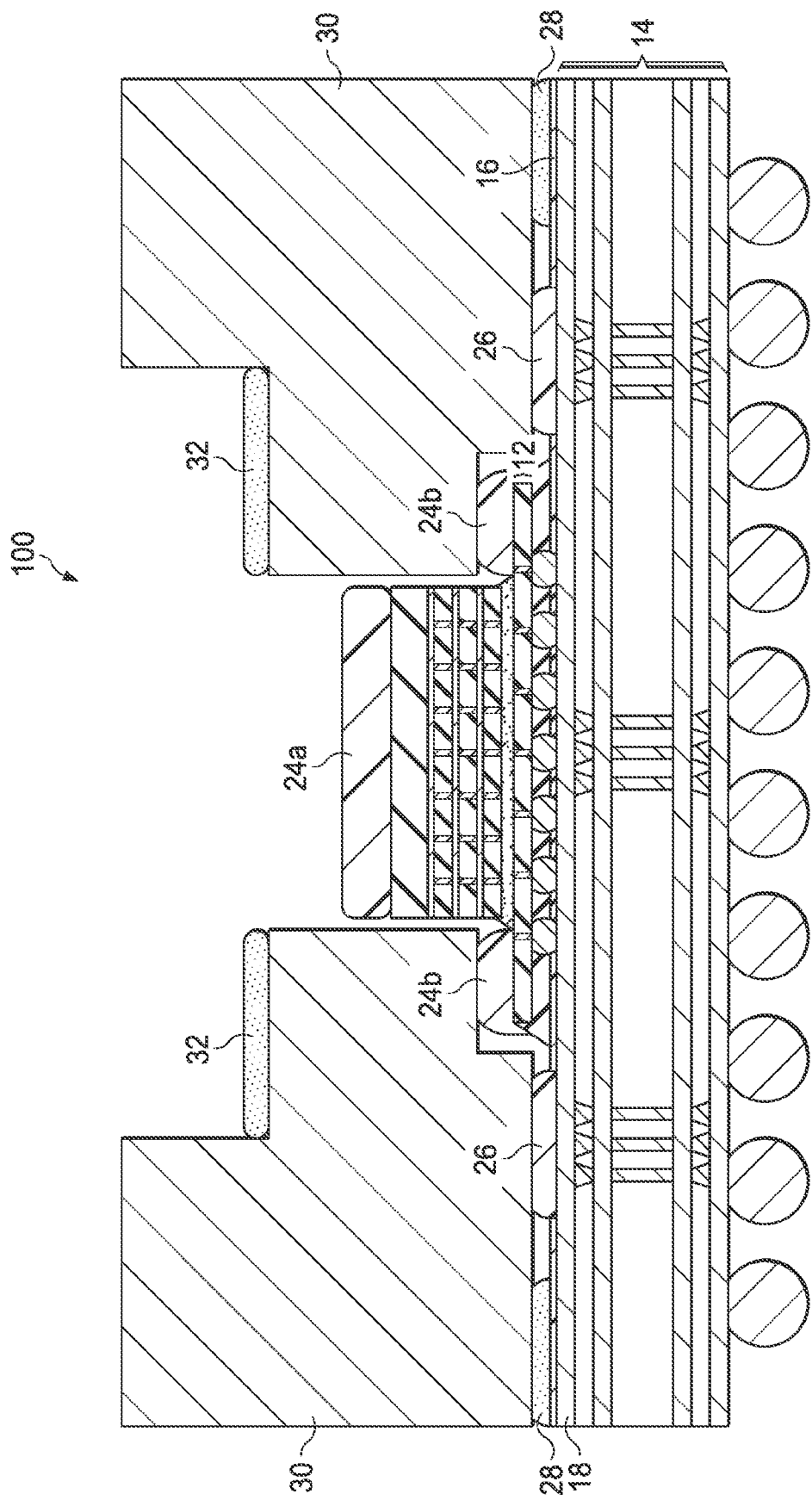

FIG. 1H illustrates a sliced cross-sectional view of the attachment of a heat dissipating contour ring 30 to substrate 14. A bottom surface of contour ring 30 may be adhered to substrate 14 through adhesive 28. In a top-down view of package 100 (not shown), contour ring 30 may encircle die stack 10/12. Contour ring 30 has a high thermal conductivity, for example, between about 200 W/m·K to about 400 W/m·K or more, and may be formed using a metal, a metal alloy, or the like. For example, contour ring 30 may comprise metals and/or metal alloys such as Al, Cu, Ni, Co, combinations thereof, and the like. Contour ring 30 may also be formed of a composite material, for example silicon carbide, aluminum nitride, graphite, and the like. Various portions of a bottom surface of contour ring 30 may contact TIM 24b and high Tk material 26. Thus, contour ring 30 allows for the dissipation of heat from TIM 24b and high Tk material 26 away from die stack 10/12. An adhesive 32, which may be substantially similar to adhesive 28, may be dispensed over portions of a top surface of contour ring 30.

Figure 1I:
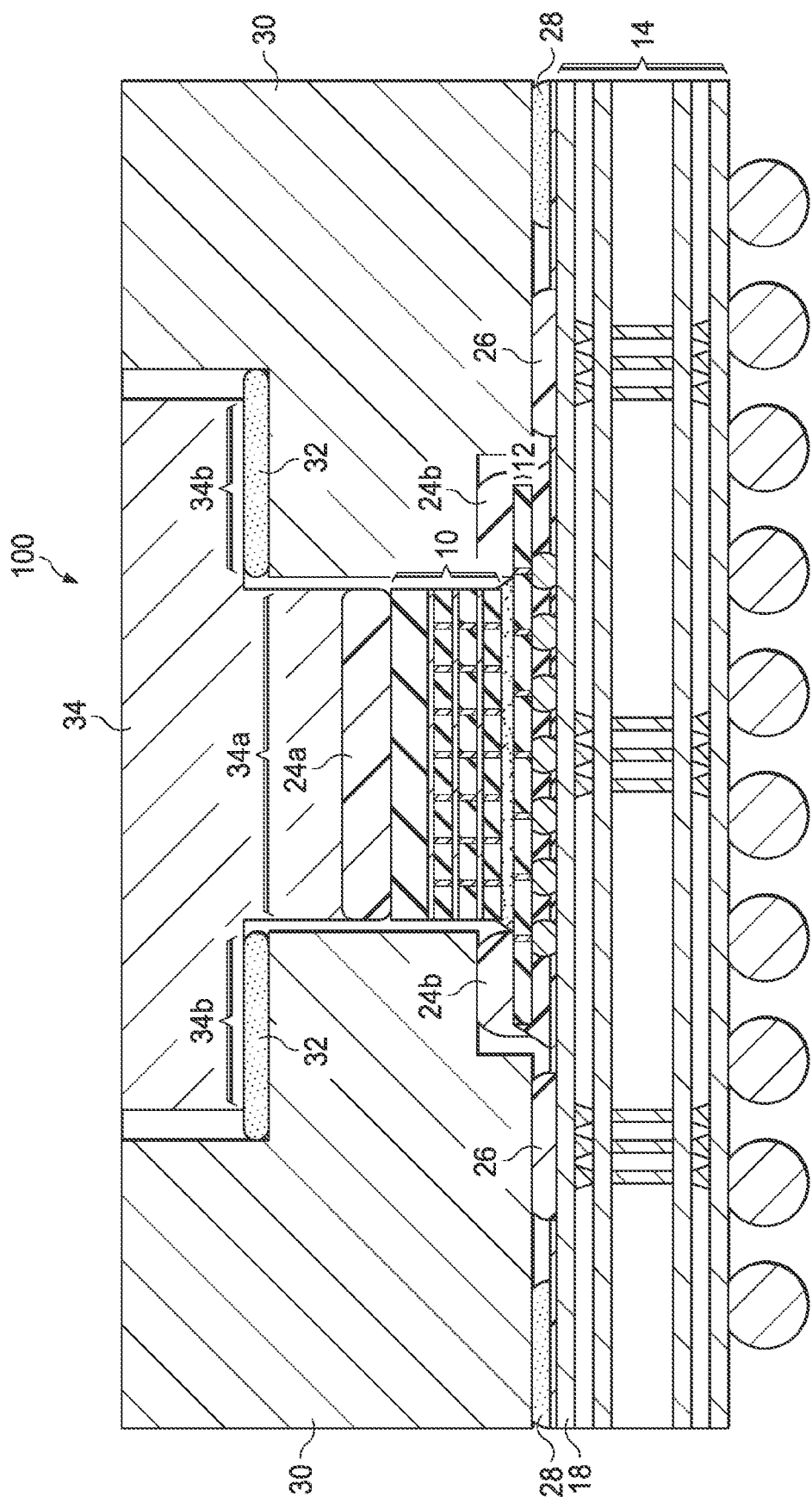

Next, referring to FIG. 1I, a heat dissipating contour lid 34 is mounted over die stack 10/12 and contour ring 30. Contour lid 34 may be formed of substantially similar materials as contour ring 30, which have a high thermal conductivity, for example, between about 200 W/m·K to about 400 W/m·K or more. Contour lid 34 includes bottom surfaces 34a and a bottom surface 34b. The position of bottom surfaces 34a and 34b are designed to fit the height of the top surface of dies 10 (and TIM portion 24a) and the location of adhesive 32. In the various embodiments illustrated in FIG. 1I, bottom surface 34a is lower than bottom surface 34b. Bottom surface 34a is in contact with TIM portion 24a allowing for heat dissipation from dies 10 through contour lid 34. Bottom surface 34b is in contact with adhesive 32, which adheres contour lid 34 to contour ring 30. The top surfaces of contour ring 30 and contour lid 34 may be substantially co-planar. Generally, the combination of contour ring 30 and contour lid 34 may be referred to as heat dissipation feature 30/34. While FIG. 1I illustrates contour ring 30 and contour lid 34 as separate pieces, in alternative embodiments, contour ring 30 and contour lid 34 may be a single piece heat dissipation feature 30/34 (e.g., see FIG. 5A).

FIG. 1J illustrates thermal dissipation away from logic core 40 in package 100 in accordance with various embodiments. Arrows 36 illustrate the path of thermal dissipation away from logic core 40 (and overlaying dies 10). As illustrated in FIG. 1J, the combination of conductive features 18/20, high Tk material 26, and contour ring 30 form hot spot thermal management features in package 100 for conducting heat away from logic core 40. Logic core 40 of die 12 is electrically connected to a conductive layer 18 having an exposed portion on a top surface of substrate 14 (e.g., portion 14a in FIG. 1A). Heat generated by logic core 40 (or other sections of die 12) is dissipated downwards to conductive features 18/20 in substrate 14 as indicated by arrows 36. The heat dissipation portion of substrate 14 is not limited to a top most, exposed conductive layer 18 alone. Rather, multiple layers of interconnected conductive layers 18 (e.g., using vias 20 and through-via 20') may be used to conduct heat away die stack 10/12. The heat is then conducted laterally away from logic core 40/die 12 by conductive features 18/20 as indicated by arrows 36b. Finally, the heat is dissipated upwards through exposed portions of conductive layer 18, high Tk material 26, and contour right 30 as indicated by arrows 36c. Thus, heat may be conducted away from die stack 10/12 and logic core 40 using conductive features in substrate 14 to avoid or reduce thermal cross talk between logic core 40 and circuits in dies 10 (e.g., DRAM circuits). Furthermore, TIM 24 may also dissipate heat away from top surfaces of die stack 10/12 through contour ring 30 and contour lid 34.

Figure 2A:
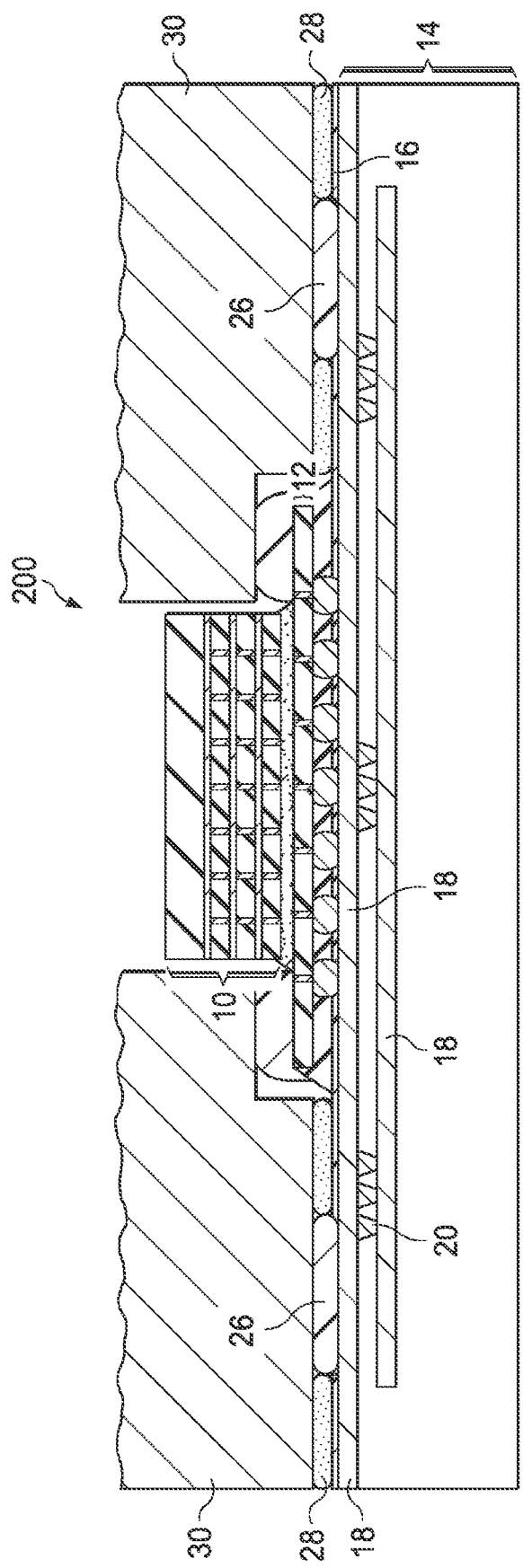
Figure 2B:
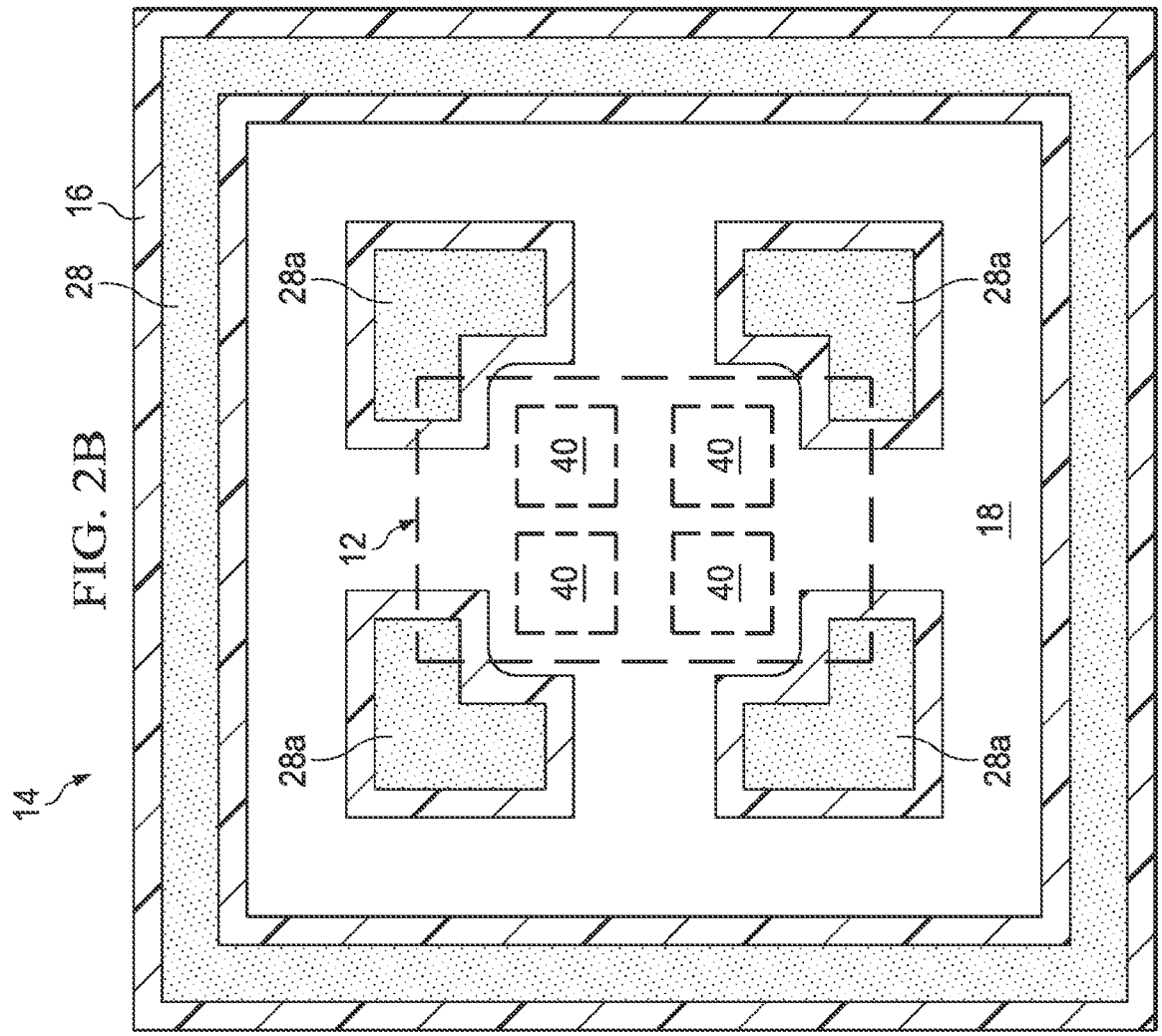

FIGS. 2A-2D illustrate cross-sectional and top down views of portions of a package 200 in accordance with various alternative embodiments. FIG. 2A illustrates a cross-sectional view of a portion of package 300. Package 200 is substantially similar to package 100, wherein like reference numbers correspond to like elements. However, the configuration of adhesive 28 and substrate 14 may be altered to allow for increased thermal conductivity as desired, for example, by exposing additional portions of conductive layer 18. A greater area of conductive layer 18 may be exposed to allow for increased heat dissipation. For example, FIG. 2B illustrates a die 12 having multiple logic cores 40, which may consume more power and generate more heat than a single logic core. To manage the high heat levels, additional portions of conductive layer 18 may be exposed to effectively dissipate heat away from die stack 10/12. However, the increased surface area of exposed conductive layer 18 may limit the area available for adhesive material 28 on the perimeter of substrate 14, negatively affecting the adhesion of contour ring 30. Thus, additional adhesive material 28a may be disposed on an interior region of substrate 14 (e.g., exposed conductive layer 18 may be disposed between adhesive 28) for increased adhesion.

FIG. 2C illustrates a top down view of substrate 14 in accordance with various alternative embodiments. In the configuration shown in FIG. 2C, die 12 includes three logic cores 40. Each logic core is disposed over separate, non-contiguous exposed conductive layers 18 (labeled 18a-18c). Exposed conductive layers 18a-18c may not be connected, allowing for thermal isolation amongst the three logic cores 40. Furthermore, exposed conductive layers 18a-18c may have varying sizes. For example, a larger logic core 40 may be disposed over a larger exposed conductive layer portion 18a to allow for increased heat dissipation. Various passive devices 50 (e.g., resistors, capacitors, transformers, and the like) may also be disposed over substrate 14, wherein exposed conductive layers 18 do not overlap or connect to passive devices 50. Adhesive 28 may be disposed around the perimeter and extended additional adhesive material 28b may be extended vertically and horizontally into the interior of substrate 14 (e.g., toward a die stack region of the package) for improved adhesion.

FIG. 2D illustrates a top down view of substrate 14 in accordance with yet another alternative embodiment. In the configuration shown in FIG. 2D, die 12 includes two logic cores 40. Logic cores 40 may be disposed in opposite corners of die 12 to increase thermal isolation between the two cores. Furthermore, logic cores 40 may be disposed over separate, unconnected exposed conductive layers 18 for increased isolation. Adhesive 28 may be disposed around the perimeter and extended diagonally from corners of substrate 14 into an interior region of substrate 14 (e.g., toward a die stack region of the package) to include adhesive material 28c for improved adhesion. As illustrated in FIGS. 2A-2C, the configuration of substrate 14 may be varied as desired depending on layout design and the configuration/power consumption levels of die stack 10/12. Thus, substrate 14 is not limited to a particular layout, and other configurations of substrate 14 are also contemplated in other embodiments.

Figure 3:
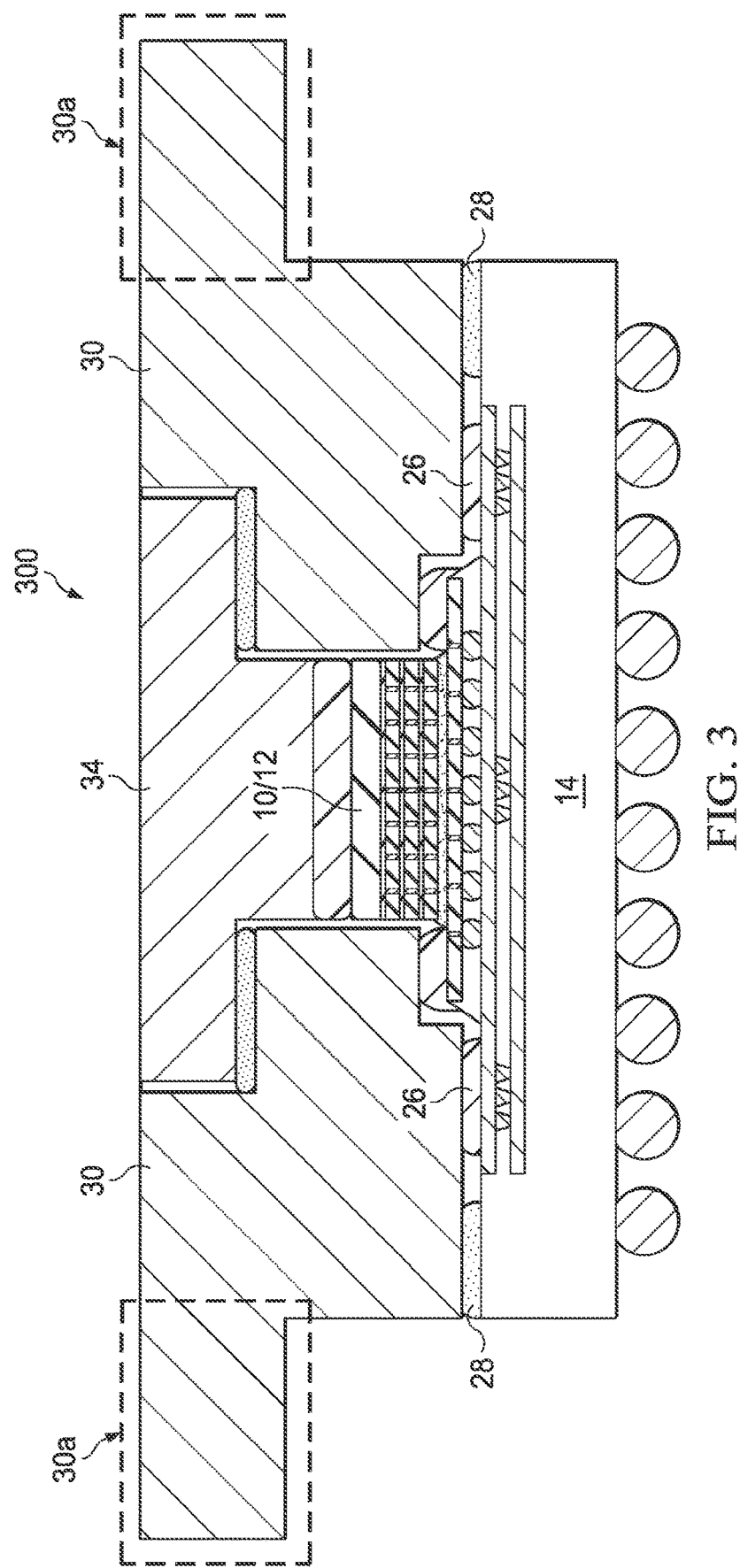
FIG. 3 illustrates a cross sectional view of the package in accordance with alternative embodiments having a contour ring with an overhang structure.

FIG. 3 illustrates a cross-sectional view of a package 300 in accordance with various alternative embodiments having an alternative contour ring configuration. Package 300 is substantially similar to package 100, wherein like reference numbers correspond to like elements. However, contour ring

30 may include additional overhang portions 30*a* extending past adhesive 28 and sidewalls of substrate 14. Overhang portions 30*a* increase the overall surface area of contour ring 30, increasing heat dissipation.

FIG. 4 illustrates a cross-sectional view of a package 400 in accordance with various alternative embodiments having an alternative configuration for die stack 10/12. Package 400 is substantially similar to package 100, wherein like reference numbers correspond to like elements. However, dies 10 may extend past die 12 in a lateral direction (i.e., dies 10 may fully overlap and cover die 12). The heat generated by die 12 may create hot spots and may affect the functional operation of dies 10. In order to manage these hot spots, in package 400, additional high Tk material 26 (labeled 26') may be disposed under dies 10 and adjacent die 12. In a top down view of package 400, high Tk material 26' may or may not form a ring around die 12. The corresponding portion of substrate 14 in contact with high Tk material 26' may include exposed conductive layers 18.

As shown in the detailed view of package 400 (labeled 400*a*), heat from dies 10 may be dissipated through additional high Tk material 26', substrate 14 (e.g., through conductive layers 18 and conductive vias 20, which may include through-vias 20'), high Tk material 26, and contour ring 30. The heat dissipation path is illustrated by arrows 36. Heat from dies 10 may also be dissipated through TIM 24 and contour lid 34 as indicated by arrows 52. Thus, high Tk material 26 may be disposed over substrate 14 as desired for additional thermal management of hot spots, and the like.

Figure 5A:
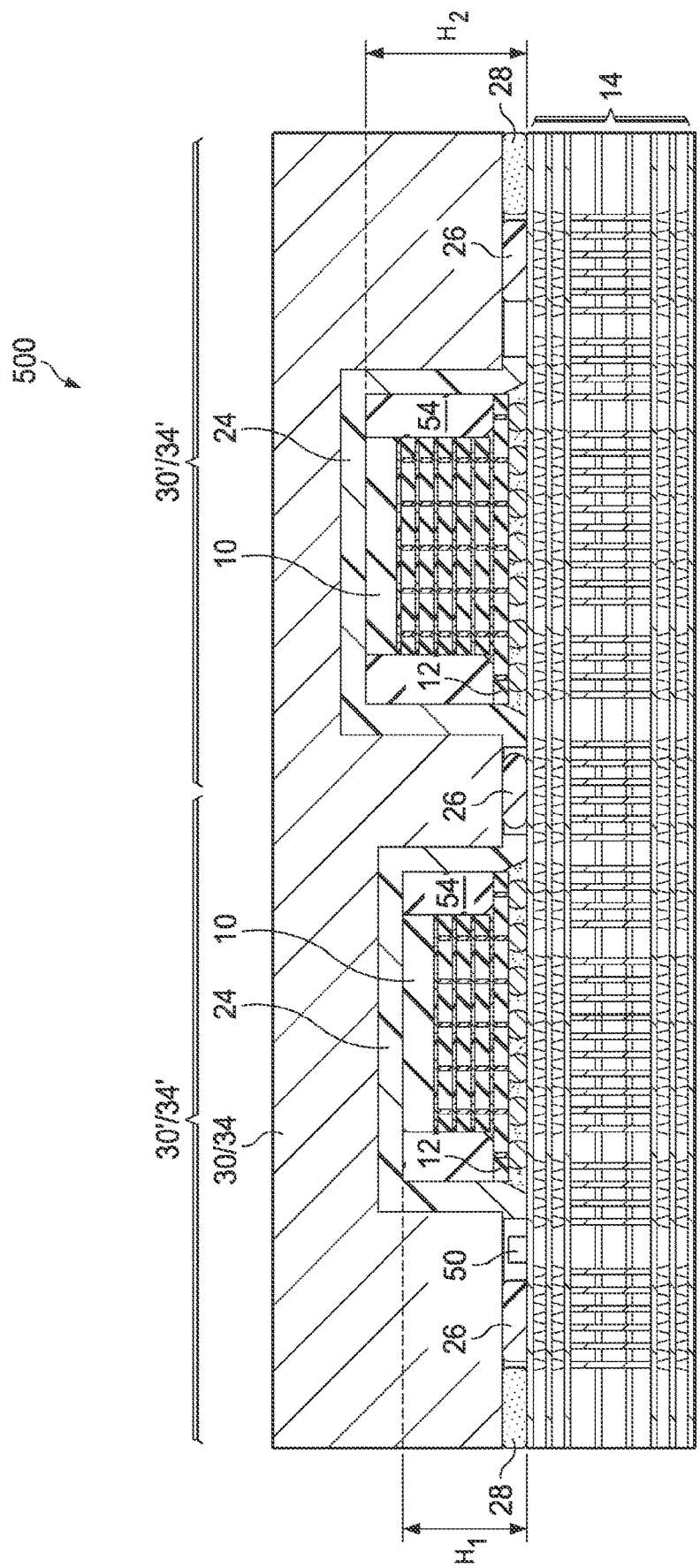

FIGS. 5A-5B illustrate a cross-sectional view of a package 500 in accordance with various alternative embodiments having multiple die stacks 10/12. Package 500 is substantially similar to package 100, wherein like reference numbers correspond to like elements. Package 500 may include plurality of die stacks 10/12 bonded to substrate 14. Die stacks 10/12 may be two transistor stacks, two interposer stacks, or a combination thereof. Furthermore, dies 10 may be encased in a molding compound 54, where outer sidewalls of molding compound 54 may be in alignment with outer sidewalls of die 12. In the illustrated examples, there are two die stacks 10/12 although other embodiments may include a more than two die stacks 10/12.

FIG. 5A illustrates a cross-sectional view of the respective package. Contour ring 30 and contour lid 34 may be a single piece heat dissipation feature 30/34. As shown in FIG. 5A, die stacks 10/12 may have heights H1 and H2, which may be equal to each other or different from each other. Accordingly, heat dissipation feature 30/34 comprises a plurality of portions 30'/34' extending down to different levels to compensate for any height difference of die stacks 10/12. Heat dissipation feature 30/34 may be in contact with high Tk material 26, which is disposed near die stacks 10/12 heat dissipation feature 30/34 may further be in contact with TIM 24, which may extend down and contact sidewalls of die stacks 10/12.

FIG. 5B illustrates a top down view of substrate 14. Heat from logic cores 40 are dissipated away from die stack 10/12 through thermal management features (i.e., exposed conductive layer 18, high Tk material 26, and heat dissipation feature 30/34) in package 500 as indicated by arrows 36. Thus, multiple die stacks of different sizes may be incorporated in a same package having thermal management features for heat dissipation away from central areas of die stacks 10/12.

Figure 6B:
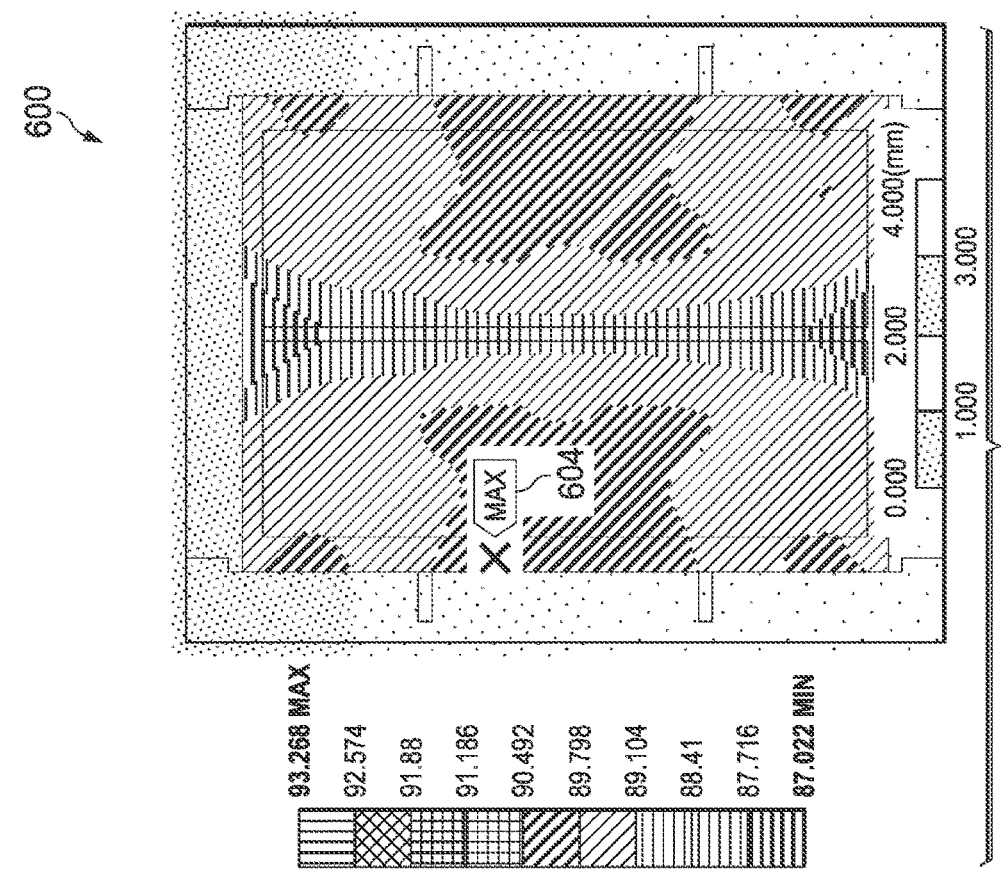
FIGS. 6A and 6B illustrate thermal performance characteristics during the operation of a package in accordance with various embodiments.
Figure 6A:
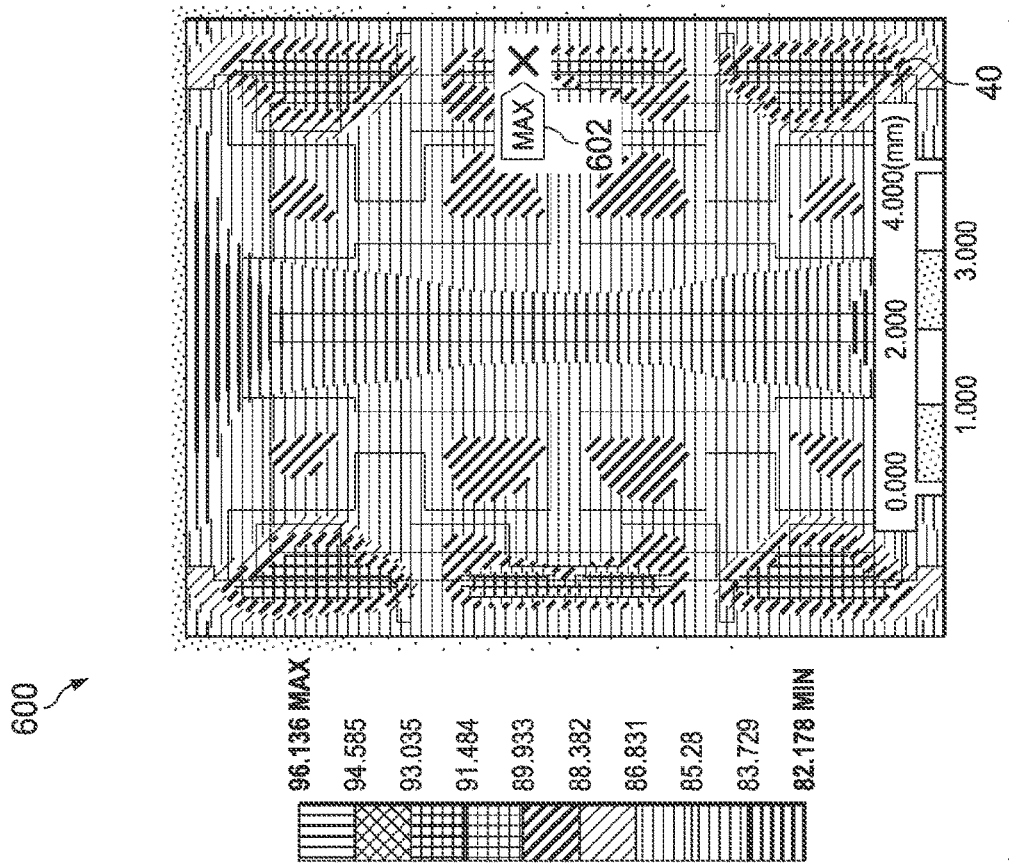

By using thermal management features (e.g., a combination of exposed conductive layers in a substrate, high Tk material, and a contour ring/cover), the heat in packages may be dissipated to peripheral areas that have less effect on the function of any overlaying dies. A simulation to simulate the temperature distribution in the packages comprising stacked dies with thermal management features results are illustrated in contour plots 600 in FIGS. 6A (showing operation temperatures of bottom die 12) and 6B (showing operation temperatures of top dies 10). As shown by FIG. 6A, hot spots are dissipated away from logic core 40 to peripheral regions of die 12. Furthermore, the maximum operation temperature 602 of the die 12 is reduced from 96.1° C. in conventional packages to 90.1° C. in accordance with embodiments. The maximum operation temperature 604 of top dies 10 is reduced from 93.3° C. in conventional packages to 89.3° C. in accordance with embodiments. Therefore, by adopting the thermal management features of the embodiments of the present disclosure, not only the operation temperatures of the packages are reduced, the hot spots are dissipated to peripheral regions of a die stack so as to have less impact on other devices in a die stack.

In accordance with an embodiment, a package includes a substrate having a conductive layer, and the conductive layer comprises an exposed portion. A die stack is disposed over the substrate and electrically connected to the conductive layer. A high thermal conductivity material is disposed over the substrate and contacting the exposed portion of the conductive layer. The package further includes a contour ring over and contacting the high thermal conductivity material.

In accordance with another embodiment, a package includes a substrate having an exposed conductive layer. The package further includes a die stack having one or more top dies electrically connected to a bottom die, wherein the bottom die includes a logic core electrically connected to the conductive layer. A high thermal conductivity material is disposed over the substrate and contacts the conductive layer, and a contour ring is disposed over and contacting the high thermal conductivity material.

In accordance with yet another embodiment, a method includes forming a conductive layer at a front side of a package substrate and forming a solder resist over the front side of the package substrate. The solder resist is patterned to expose a portion of the conductive layer. A die stack is attached to the front side of the package substrate, wherein the die stack is electrically connected to the conductive layer. A high thermal conductivity material is disposed over and physically contacting the exposed portion of the conductive layer. The method further includes attaching a heat dissipation feature to the front side of the package substrate, wherein the heat dissipation feature is in physical contact with the high thermal conductivity material.

In accordance with an embodiment, a package includes a substrate comprising a conductive layer; a first die stack over the substrate and electrically connected to the conductive layer; a second die stack over the substrate and adjacent the first die stack, wherein the first die stack extends higher than the second die stack; a thermally conductive material over the substrate and contacting an electrically conductive material of conductive layer; and a heat dissipation feature thermally connected to the electrically conductive material through the thermally conductive material. A first bottom surface of the heat dissipation feature over the first die stack is higher than a second bottom surface of the heat dissipation feature over the second die stack, and a portion of the heat dissipation feature extends between the first die stack and the second die stack along a line parallel to a top surface of the substrate.

In accordance with an embodiment, a method includes forming a conductive layer at a front side of a package substrate; forming a solder resist over the front side of the package substrate; patterning a first opening exposing a first portion of the conductive layer through the solder resist; patterning a second opening exposing a second portion of the conductive layer through the solder resist, the second portion of the conductive layer being electrically connected to the first portion of the conductive layer; attaching a die stack to the package substrate, wherein the die stack is electrically connected to the conductive layer, and wherein the die stack comprises one or more top dies bonded to a bottom die; disposing a first thermally conductive material in the first opening and physically contacting the first portion of the conductive layer; disposing a second thermally conductive material in the second opening and physically contacting the second portion of the conductive layer, wherein a line perpendicular to a top surface of the package substrate extends through the package substrate, the second thermally conductive material, and the one or more top dies; and attaching a heat dissipation feature to the package substrate, wherein the heat dissipation feature is thermally connected to the second thermally conductive material through the first thermally conductive material.

In accordance with an embodiment, a package includes a die stack bonded to a front side of a package substrate, wherein the die stack is electrically connected to a conductive layer at a front side of the package substrate; a first material over and physically contacting an electrically conductive material of the conductive layer, wherein the first material has a thermal conductivity between 3 W/m·K and 50 W/m·K; and a heat dissipation feature attached to the front side of the package substrate using an adhesive having a lower thermal conductivity than the first material. The heat dissipation feature is in physical contact with the first material, and the adhesive is disposed on opposing sidewalls of the first material.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    a package substrate having a conductive layer and a solder resist on a same side;
    a die stack provided over the package substrate;
    a thermal interface material (TIM) directly over the conductive layer and contacting the solder resist, wherein the TIM is disposed at a same level as a top surface of the solder resist; and
    a heat dissipation feature disposed over the TIM.

2. The package of claim 1, wherein the heat dissipation feature is adhered to the package substrate by an adhesive material.

3. The package of claim 2, wherein the adhesive material has a lower thermal conductivity than the thermal interface material.

4. The package of claim 2, wherein the adhesive material is disposed on opposing sides of the thermal interface material.

5. The package of claim 1, wherein the conductive layer is a signal, a power, or a ground layer.

6. The package of claim 1, wherein the conductive layer comprises a dummy feature.

7. The package of claim 1, wherein the die stack comprises a plurality of memory dies.

8. The package of claim 1, wherein the conductive layer extends continuously from directly under the die stack to directly under the TIM.

9. The package of claim 1, wherein the TIM contacts a top surface of the conductive layer.

10. A package comprising:
    a package substrate having a conductive layer and a polymer on a same side;
    a die stack over the package substrate;
    a thermal interface material (TIM) in a region directly above the conductive layer, the TIM being disposed between a first portion of the polymer and a second portion of the polymer, the first portion of the polymer and the second portion of the polymer being on opposing sides of the region; and
    a heat dissipation feature over the TIM, the conductive layer, and the polymer.

11. The package of claim 10, wherein the heat dissipation feature is attached to a top surface of the die stack by a second TIM.

12. The package of claim 10, wherein the heat dissipation feature is attached to a top surface of the package substrate by an adhesive.

13. The package of claim 12, wherein the TIM has a higher thermal conductivity than the adhesive.

14. The package of claim 10, wherein the TIM contacts a sidewall of the first portion of the polymer and a sidewall of the second portion of the polymer.

15. The package of claim 10, wherein the die stack comprises a plurality of memory dies.

16. A package comprising:
    a package substrate having a conductive layer and a polymer on a same side;
    a die stack provided over the package substrate;
    a thermal interface material (TIM) directly contacting a first sidewall of the polymer and a second sidewall of the polymer; and
    a heat dissipation feature disposed above the TIM, wherein the conductive layer extends continuously from directly under the die stack to directly under the TIM.

17. The package of claim 16, wherein the heat dissipation feature contacts the TIM.

18. The package of claim 16, wherein the heat dissipation feature is adhered to the package substrate using an adhesive having a lower thermal conductivity than the TIM.

19. The package of claim 18, wherein the adhesive is disposed on opposing sidewalls of the TIM.

20. The package of claim 16, wherein the die stack comprises a plurality of memory dies.

* * * * *